US012191350B2

(12) United States Patent
Liu

(10) Patent No.: US 12,191,350 B2
(45) Date of Patent: Jan. 7, 2025

(54) METHOD OF MANUFACTURING SEMICONDUCTOR STRUCTURE AND SEMICONDUCTOR STRUCTURE

(71) Applicant: CHANGXIN MEMORY TECHNOLOGIES, INC., Hefei (CN)

(72) Inventor: Chih-Cheng Liu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 409 days.

(21) Appl. No.: 17/805,510

(22) Filed: Jun. 6, 2022

(65) Prior Publication Data
US 2023/0124494 A1 Apr. 20, 2023

Related U.S. Application Data

(63) Continuation of application No. PCT/CN2021/131719, filed on Nov. 19, 2021.

(30) Foreign Application Priority Data

Oct. 15, 2021 (CN) .......................... 202111202940.5

(51) Int. Cl.
*H01L 29/06* (2006.01)
*H01L 29/10* (2006.01)
(Continued)

(52) U.S. Cl.
CPC ...... *H01L 29/0619* (2013.01); *H01L 29/1095* (2013.01); *H10B 12/053* (2023.02); *H10B 12/34* (2023.02); *H01L 29/4236* (2013.01)

(58) Field of Classification Search
CPC ............. H01L 29/0619; H01L 29/1095; H01L 29/4236; H10B 12/053; H10B 12/34; H10B 12/488
See application file for complete search history.

(56) References Cited

U.S. PATENT DOCUMENTS 7,863,675 B2 1/2011 Bhalla et al.
9,236,439 B2 * 1/2016 Jeong ................ H01L 29/42372
(Continued)

FOREIGN PATENT DOCUMENTS

CN  1400653 A  3/2003
CN  101308787 A  11/2008
(Continued)

OTHER PUBLICATIONS

International Search Report cited in PCT/CN2021/131719 mailed Jun. 24, 2022, 8 pages.

*Primary Examiner* — J. E. Schoenholtz
(74) *Attorney, Agent, or Firm* — Kilpatrick Townsend & Stockton LLP

(57) ABSTRACT

The present disclosure provides a method of manufacturing a semiconductor structure, and a semiconductor structure. The method of manufacturing a semiconductor structure includes: providing a base, where a channel is formed in the base; forming a gate conductive layer, where the gate conductive layer covers a part of the channel; and forming a semiconductor doped layer, where the semiconductor doped layer fills the channel and covers the gate conductive layer, and a doping concentration of the semiconductor doped layer at a side close to a top surface of the gate conductive layer is different from a doping concentration of the semiconductor doped layer at a side away from the top surface of the gate conductive layer.

15 Claims, 7 Drawing Sheets

(51) Int. Cl.
*H01L 29/423* (2006.01)
*H10B 12/00* (2023.01)

(56) References Cited

U.S. PATENT DOCUMENTS

| | | | |
|---|---|---|---|
| 10,483,374 B2* | 11/2019 | Kim | ........................ H10B 63/30 |
| 11,211,466 B2 | 12/2021 | Kwon et al. | |
| 2014/0061781 A1* | 3/2014 | Kim | .................... H01L 29/4236 |
| | | | 257/331 |
| 2018/0248003 A1 | 8/2018 | Nakamura et al. | |
| 2021/0035979 A1 | 2/2021 | Simsek-Ege et al. | |

FOREIGN PATENT DOCUMENTS

| CN | 101752233 A | 6/2010 |
|---|---|---|
| CN | 102420118 A | 4/2012 |
| CN | 112447521 A | 3/2021 |

\* cited by examiner

METHOD OF MANUFACTURING SEMICONDUCTOR STRUCTURE AND SEMICONDUCTOR STRUCTURE

CROSS-REFERENCE TO RELATED APPLICATIONS

This is a continuation of International Application No. PCT/CN2021/131719, filed on Nov. 19, 2021, which claims the priority to Chinese Patent Application No. 202111202940.5, titled "METHOD OF MANUFACTURING SEMICONDUCTOR STRUCTURE AND SEMICONDUCTOR STRUCTURE" and filed on Oct. 15, 2021. The entire contents of International Application No. PCT/CN2021/131719 and Chinese Patent Application No. 202111202940.5 are incorporated herein by reference.

TECHNICAL FIELD

The present disclosure relates to, but is not limited to, a method of manufacturing a semiconductor structure and a semiconductor structure.

BACKGROUND

With the development of dynamic random access memory (DRAM), a recess channel array transistor (RCAT) is generally applied to the DRAM to reduce a gate channel length of the transistor and improve the integration of the DRAM.

However, the RCAT is prone to a gate-induce drain leakage (GIDL) current, which affects the reliability of the DRAM.

SUMMARY

An overview of the subject matter detailed in the present disclosure is provided below, which is not intended to limit the protection scope of the claims.

The present disclosure provides a method of manufacturing a semiconductor structure and a semiconductor structure.

A first aspect of the present disclosure provides a method of manufacturing a semiconductor structure. The method of manufacturing a semiconductor structure includes:

providing a base, where a channel is formed in the base;

forming a gate conductive layer, where the gate conductive layer covers a part of the channel; and forming a semiconductor doped layer, where the semiconductor doped layer fills the channel and covers the gate conductive layer, and a doping concentration of the semiconductor doped layer at a side close to a top surface of the gate conductive layer is different from a doping concentration of the semiconductor doped layer at a side away from the top surface of the gate conductive layer.

A second aspect of the present disclosure provides a semiconductor structure, where the semiconductor structure includes:

a base, where the base includes a channel;

a gate conductive layer, where the gate conductive layer covers a part of the channel; and a semiconductor doped layer, where the semiconductor doped layer fills the channel and covers the gate conductive layer, and a doping concentration of the semiconductor doped layer at a side close to a top surface of the gate conductive layer is different from a doping concentration of the semiconductor doped layer at a side away from the top surface of the gate conductive layer.

Other aspects of the present disclosure are understandable upon reading and understanding of the accompanying drawings and detailed description.

BRIEF DESCRIPTION OF THE DRAWINGS

The accompanying drawings incorporated into the specification and constituting part of the specification illustrate the embodiments of the present disclosure, and are used together with the description to explain the principles of the embodiments of the present disclosure. In these accompanying drawings, similar reference numerals are used to represent similar elements. The accompanying drawings in the following description are part rather than all of the embodiments of the present disclosure. Those skilled in the art may derive other accompanying drawings based on these accompanying drawings without creative efforts.

DETAILED DESCRIPTION

The technical solutions in the embodiments of the present disclosure are described below clearly and completely with reference to the accompanying drawings in the embodiments of the present disclosure. Apparently, the described embodiments are merely some rather than all of the embodiments of the present disclosure. All other embodiments obtained by those skilled in the art based on the embodiments of the present disclosure without creative efforts should fall within the protection scope of the present disclosure. It should be noted that the embodiments in the present disclosure and features in the embodiments may be combined with each other in a non-conflicting manner.

Figure 1:
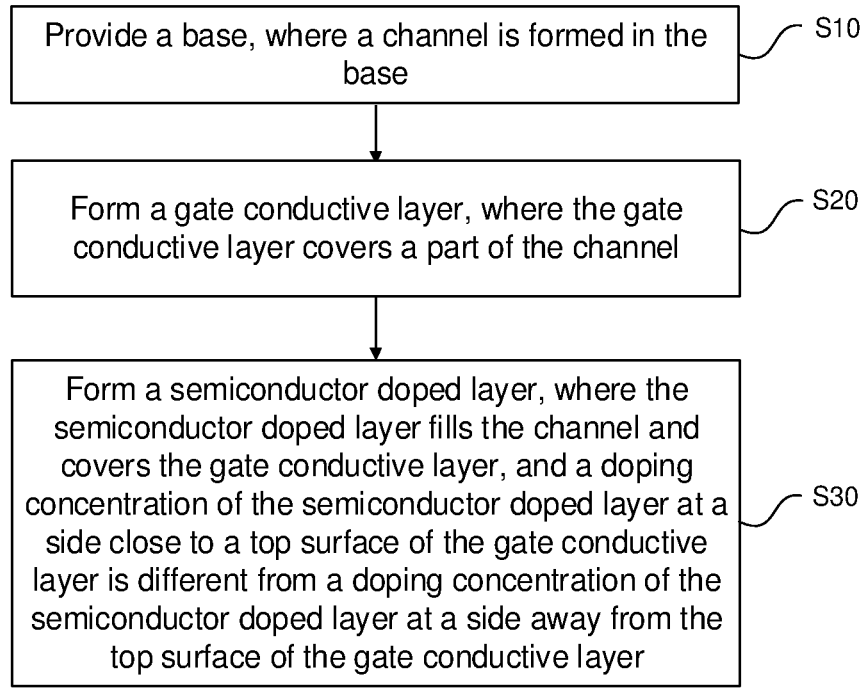
FIG. 1 is a flowchart of a method of manufacturing a semiconductor structure according to an exemplary embodiment.

An exemplary embodiment of the present disclosure provides a method of manufacturing a semiconductor structure, as shown in FIG. 1. FIG. 1 is a flowchart of a method of manufacturing a semiconductor structure according to an exemplary embodiment of the present disclosure. FIG. 4 to FIG. 11 are schematic diagrams of various stages of the method of manufacturing a semiconductor structure. The method of manufacturing a semiconductor structure is described below with reference to FIG. 4 to FIG. 11.

The semiconductor structure is not limited in this embodiment. The semiconductor structure is described below by using a recess channel transistor (referred to as transistor for short hereinafter) as an example, but this embodiment is not limited to this. Alternatively, the semiconductor structure in the embodiment may be other structures. It should be understood that, the semiconductor structure formed in this embodiment does not constitute an integrated transistor. This embodiment merely describes a forming process of a gate electrode of the transistor.

As shown in FIG. 1, an exemplary embodiment of the present disclosure provides a method of manufacturing a semiconductor structure, including:

S10: Provide a base, where a channel is formed in the base.

Figure 4:
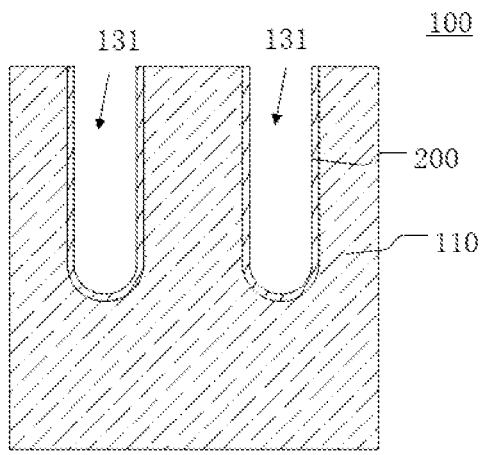
FIG. 4 is a schematic diagram of a base provided in a method of manufacturing a semiconductor structure according to an exemplary embodiment.

As shown in FIG. 4, the base 100 includes an active region 110. The active region 110 may be a P-type active region or an N-type active region. A material of the active region 110 includes a semiconductor material. For example, the material of the active region 110 may be one or more of a group consisting of silicon, germanium, a silicon-germanium compound, and a silicon-carbon compound. The channel 131 is formed in the active region 110. In this embodiment, the formed channel 131 is a gate channel.

As shown in FIG. 4, the base 100 further includes a gate oxide layer 200, and the channel 131 is defined by the gate oxide layer 200. A material of the gate oxide layer 200 is silicon oxide. For example, a material of the gate oxide layer 200 is silicon dioxide.

In some embodiments, the providing a base 100 includes: providing an initial base, etching the initial base to form gate trenches, and forming the gate oxide layer 200 in each of the gate trenches, where the gate oxide layer 200 covers an inner surface of the gate trench, and the gate oxide layer 200 defines the channel 131 in the gate trench.

S20: Form a gate conductive layer, where the gate conductive layer covers a part of the channel.

Figure 6:
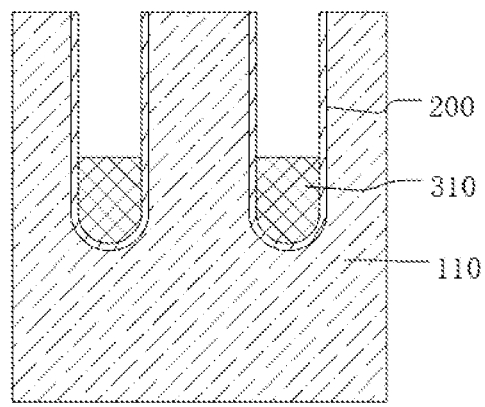
FIG. 6 is a schematic diagram of forming a gate conductive layer in a method of manufacturing a semiconductor structure according to an exemplary embodiment.

As shown in FIG. 6, referring to FIG. 4, the gate conductive layer 310 is located at the bottom of the channel 131, fills a part of the channel 131, and covers a part of the gate oxide layer 200. A material of the gate conductive layer 310 may include a metal nitride, for example, titanium nitride or indium nitride. In this embodiment, the material of the gate conductive layer 310 includes titanium nitride.

In this embodiment, the forming a gate conductive layer 310 includes:

S21: Fill the channel with an initial gate conductive layer.

Figure 5:
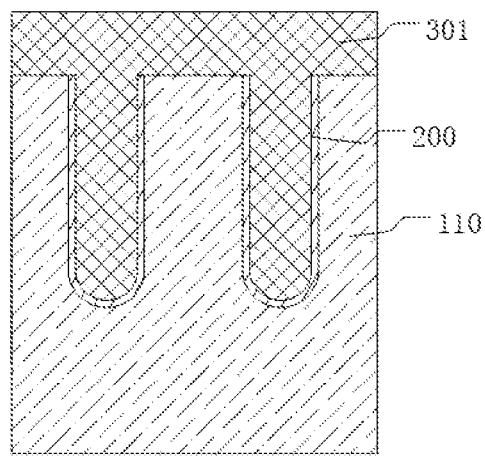
FIG. 5 is a schematic diagram of forming an initial gate conductive layer in a method of manufacturing a semiconductor structure according to an exemplary embodiment.

As shown in FIG. 5, referring to FIG. 4, a gate conductive material may be deposited through atomic layer deposition (ALD) or chemical vapor deposition (CVD). The gate conductive material fills the channel 131 and covers the top surface of the base 100, to form the initial gate conductive layer 301.

S22: Etch back the initial gate conductive layer, and retain a part of the initial gate conductive layer having a height greater than or equal to ⅓ of a depth of the channel, to form the gate conductive layer.

As shown in FIG. 6, referring to FIG. 5, a part of the initial gate conductive layer 301 is removed through back etching, to form the gate conductive layer 310. In this embodiment, the height of the formed gate conductive layer 310 is greater than ⅓ of the depth of the channel 131.

S30: Form a semiconductor doped layer, where the semiconductor doped layer fills the channel and covers the gate conductive layer, and a doping concentration of the semiconductor doped layer at a side close to a top surface of the gate conductive layer is different from a doping concentration of the semiconductor doped layer at a side away from the top surface of the gate conductive layer.

Figure 7:
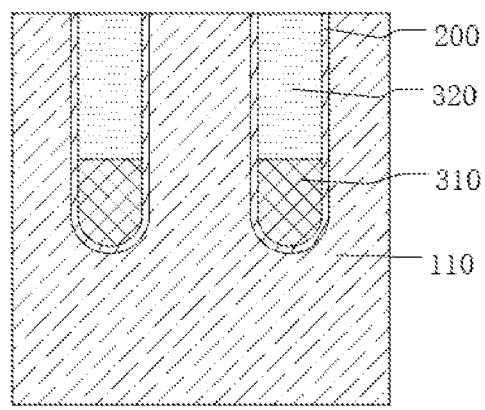
FIG. 7 is a schematic diagram of forming a semiconductor structure in a method of manufacturing a semiconductor structure according to an exemplary embodiment.

As shown in FIG. 7, the semiconductor doped layer 320 may be formed by in-situ doping a semiconductor material through low pressure chemical vapor deposition (LPCVD), or formed by depositing an undoped semiconductor material that fills the channel 131 to form a semiconductor material layer and then implanting doped impurities into the semiconductor material layer through a thermal diffusion process or an ion implantation process.

A threshold voltage (TV) of a transistor depends on a difference between work functions (WFs) of a gate electrode and a gate channel. In the semiconductor structure formed in this embodiment, the gate electrode includes the gate conductive layer disposed at the bottom of the gate channel and the semiconductor doped layer covering the top surface of the gate conductive layer. Work functions of the metal nitride in the gate conductive layer and the gate channel have a large difference; work functions of the semiconductor doped layer and the material forming the active region of the gate channel have a small difference. That is, the gate electrode has a large threshold voltage near the bottom of the gate channel and a small threshold voltage near the top surface of the base. The gate electrode has a large threshold voltage near the bottom of the gate channel, which can avoid charge leakage from the transistor to adjacent transistors. The gate electrode has a small threshold voltage near the top surface of the base; therefore, the gate-drain overlapping interface of the transistor has a small voltage, avoiding gate-induce drain leakage at the gate-drain overlapping interface of the transistor.

According to an exemplary embodiment of the present disclosure, this embodiment is a further description of step S30 in the foregoing embodiment.

Figure 2:
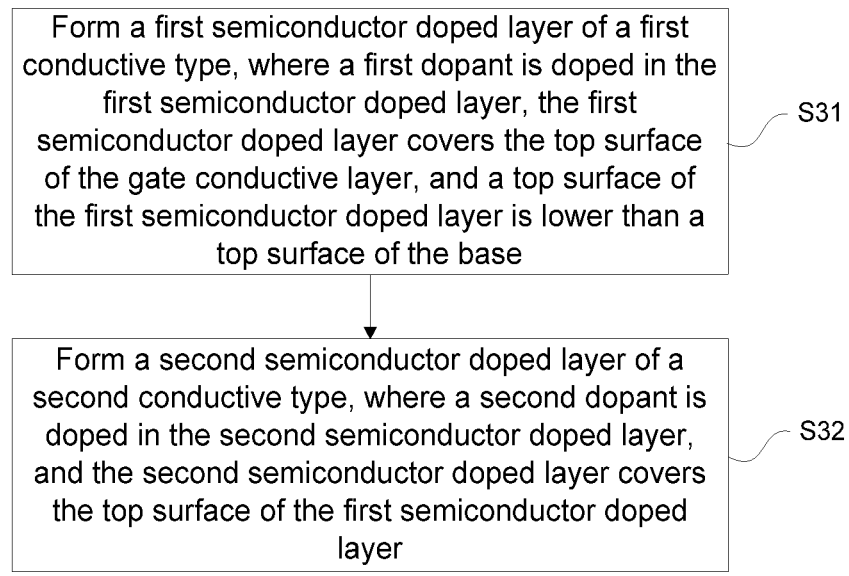
FIG. 2 is a flowchart of forming a semiconductor doped layer in a method of manufacturing a semiconductor structure according to an exemplary embodiment.

As shown in FIG. 2, the forming a semiconductor doped layer includes:

S31: Form a first semiconductor doped layer, where the first semiconductor doped layer covers the top surface of the gate conductive layer, and a top surface of the first semiconductor doped layer is lower than a top surface of the base.

Figure 8:
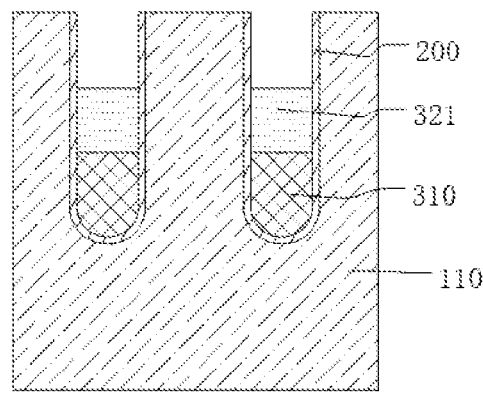
FIG. 8 is a schematic diagram of forming a first semiconductor doped layer in a method of manufacturing a semiconductor structure according to an exemplary embodiment.

As shown in FIG. 8, referring to FIG. 1 and FIG. 7, the process of forming the first semiconductor doped layer 321 includes: depositing a first semiconductor material to fill the channel 131, etching back the first semiconductor material in the channel 131 to be lower than the top surface of the base 100, and implanting a dopant into the first semiconductor material through an ion implantation process, to form the first semiconductor doped layer 321.

In some embodiments, the forming a first semiconductor doped layer includes:

S31a: Deposit a first semiconductor material, and performing first doping on the first semiconductor material to form a first doped region, where the first doped region covers the top surface of the gate conductive layer.

The first doping may be performed on the undoped first semiconductor material through ion implantation.

S31b: Perform second doping on the first semiconductor material to form a second doped region, where the second doped region covers a top surface of the first doped region.

Figure 10:
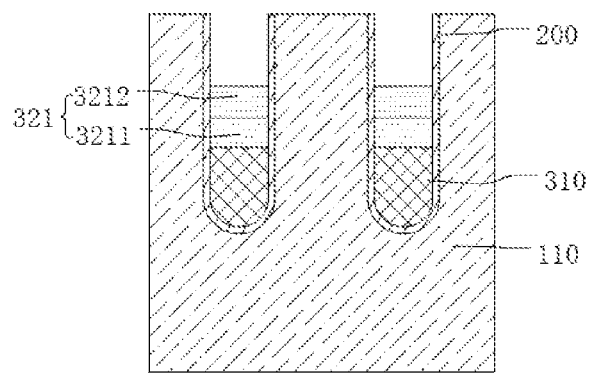
FIG. 10 is a schematic diagram of forming a first semiconductor doped layer in a method of manufacturing a semiconductor structure according to an exemplary embodiment.

As shown in FIG. 10, a doping concentration of the second doped region 3212 is different from that of the first doped region 3211.

The second doping may be performed, through ion implantation, on the first semiconductor material on which the first doping has been performed, where an injection depth of the second doping is less than an injection depth of the first doping. As shown in FIG. 10, a region lower than the injection depth of the second doping in the formed first semiconductor doped layer 321 is the first doped region 3211, and a region within the injection depth of the second doping is the second doped region 3212, where the doping concentration of the second doped region 3212 is greater than the doping concentration of the first doped region 3211.

In some embodiments, during deposition of the first semiconductor material, doping may be performed on the first semiconductor material only once. The first semiconductor material is doped while the first semiconductor material is deposited, and the doping concentration changes gradually. The concentration of the first semiconductor doped layer 321 formed in this manner changes gradually in a direction perpendicular to the base 100.

S32: Form a second semiconductor doped layer, where the second semiconductor doped layer covers the top surface of the first semiconductor doped layer.

A doping concentration of the second semiconductor doped layer is different from a doping concentration of the first semiconductor doped layer. For example, the doping concentration of the second semiconductor doped layer 322 may be greater than or less than the doping concentration of the first semiconductor doped layer 321. In this embodiment, the doping concentration of the second semiconductor doped layer 322 is greater than the doping concentration of the first semiconductor doped layer 321.

Figure 9:
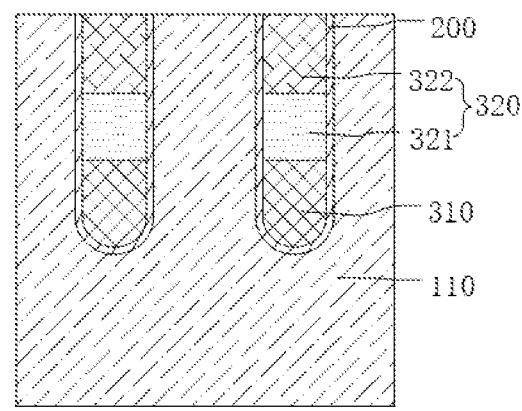
FIG. 9 is a schematic diagram of forming a second semiconductor doped layer in a method of manufacturing a semiconductor structure according to an exemplary embodiment.

As shown in FIG. 9, referring to FIG. 8, the operation of forming the second semiconductor doped layer 322 includes: placing the semiconductor structure in a reaction chamber, and providing a reaction source gas, a dopant gas, and a carrier gas to the reaction chamber, and depositing a semiconductor doping material through LPCVD, where the semiconductor doping material fills the channel 131 to form the second semiconductor doped layer 322.

For example, the second semiconductor doped layer 322 may be a semiconductor material containing silicon or germanium. In this example, an N-type doped semiconductor material may be deposited through LPCVD by using one or both of a silicon source gas or germanium source gas as the reaction source gas, one or both of phosphine ($PH_3$) or hydrogen arsenide ($AsH_3$) as the dopant gas, and hydrogen ($H_2$) as the carrier gas, where the N-type doped semiconductor material fills the channel 131 to form the second semiconductor doped layer 322.

In some embodiments, the forming a second semiconductor doped layer includes:

S32a: Deposit a second semiconductor material, and performing first doping on the second semiconductor material to form a third doped region, where the third doped region covers the top surface of the first semiconductor doped layer.

S32b: Perform second doping on the second semiconductor material to form a fourth doped region, where the fourth doped region covers a top surface of the third doped region.

A doping concentration of the fourth doped region is different from that of the third doped region.

Figure 11:
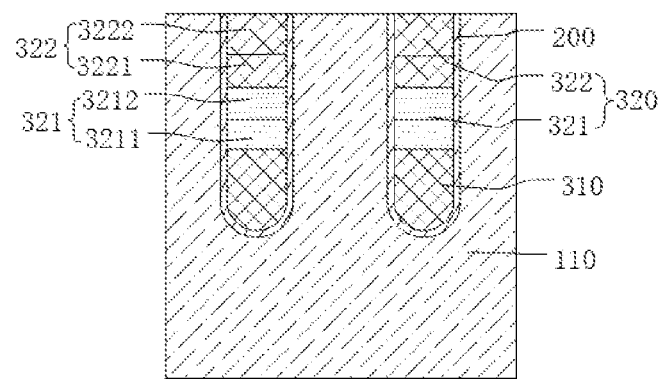
FIG. 11 is a schematic diagram of forming a semiconductor structure in a method of manufacturing a semiconductor structure according to an exemplary embodiment.

As shown in FIG. 11, referring to FIG. 10, the third doped region 3221 and the fourth doped region 3222 form the second semiconductor doped layer 322.

In this embodiment, the second semiconductor doped layer 322 and the first semiconductor doped layer 321 are of a same conductive type. If the conductive type of the first semiconductor doped layer 321 is N-type doping, the conductive type of the second semiconductor doped layer 322 is also N-type doping. If the conductive type of the first semiconductor doped layer 321 is P-type doping, the conductive type of the second semiconductor doped layer 322 is also P-type doping.

The conductive types of the first semiconductor doped layer 321 and the second semiconductor doped layer 322 are configured according to the active region 110. If the active region is a P-type active region, the conductive types of the first semiconductor doped layer 321 and the second semiconductor doped layer 322 are configured to be N-type doping. If the active region 110 is an N-type active region, the conductive types of the first semiconductor doped layer 321 and the second semiconductor doped layer 322 are configured to be P-type doping.

The work function of the semiconductor material may be changed through ion doping. The work function of the semiconductor material is equal to a difference between a vacuum level and a Fermi level of the semiconductor material. The Fermi level of the semiconductor material is related to the carrier density of the semiconductor material, and the carrier density in the semiconductor material is affected by the doped impurities and doping concentration. Therefore, in this embodiment, the doping concentration of the first semiconductor doped layer is different from that of the second semiconductor doped layer, and the work function of the first semiconductor doped layer is different from that of the second semiconductor doped layer. By modulating the work function of the semiconductor material, a segmented varying electric field is formed in the gate channel, which can effectively avoid the problem that some positions of the gate channel are prone to breakdown due to excessively high electric field intensity, thus causing device damage and failure.

Figure 3:
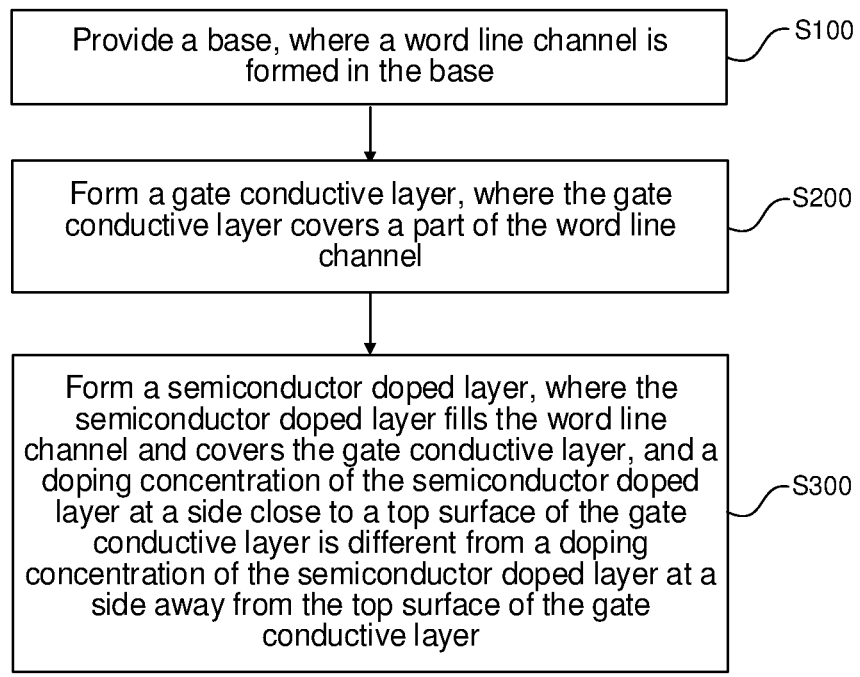
FIG. 3 is a flowchart of a method of manufacturing a semiconductor structure according to an exemplary embodiment.

An exemplary embodiment of the present disclosure provides a method of manufacturing a semiconductor structure, as shown in FIG. 3. FIG. 3 is a flowchart of a method of manufacturing a semiconductor structure according to an exemplary embodiment of the present disclosure. FIG. 12 to FIG. 20 are schematic diagrams of various stages of the method of manufacturing a semiconductor structure. The method of manufacturing a semiconductor structure is described below with reference to FIG. 12 to FIG. 20.

The semiconductor structure is not limited in this embodiment. The semiconductor structure is described below by taking a DRAM as an example, but this embodiment is not limited thereto, and the semiconductor structure in this embodiment may also be other structures.

As shown in FIG. 3, an exemplary embodiment of the present disclosure provides a method of manufacturing a semiconductor structure, including:

Step S100: Provide a base, where a word line channel is formed in the base.

Figure 12:
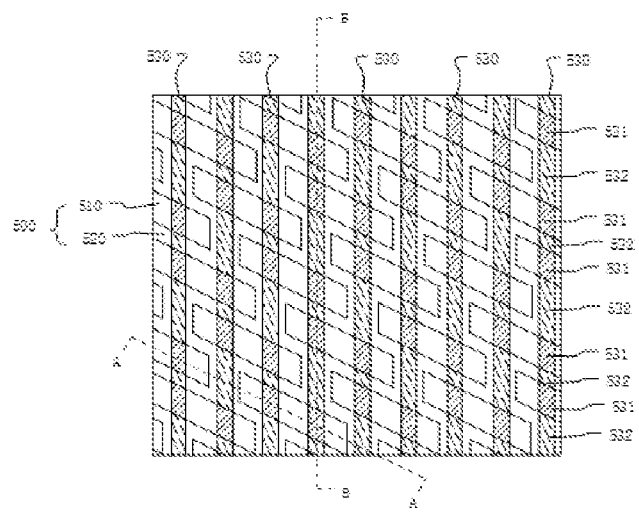
FIG. 12 is a top view of a base provided in a method of manufacturing a semiconductor structure according to an exemplary embodiment.
Figure 13:
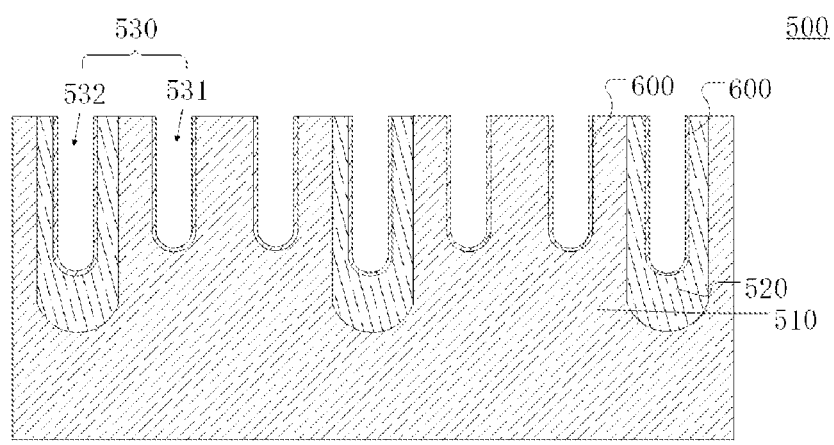
FIG. 13 is a schematic diagram of a cross section taken along A-A in FIG. 12.
Figure 14:
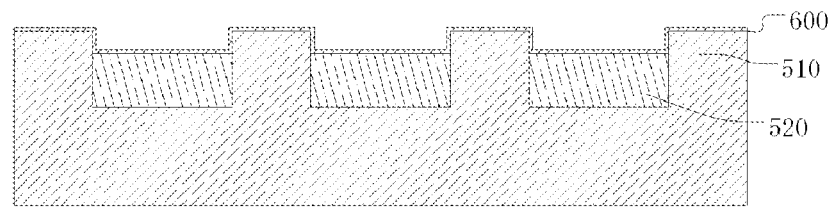
FIG. 14 is a schematic diagram of a cross section taken along B-B in FIG. 12.

FIG. 12 is a top view of a base 500; FIG. 13 is a schematic diagram of a cross section of the base in FIG. 12 taken along A-A; FIG. 14 is a schematic diagram of a cross section of the base in FIG. 12 taken along B-B. In this embodiment, the direction A-A is an extension direction of an active region, and direction B-B is an extension direction of the word line channel.

As shown in FIG. 12, FIG. 13, and FIG. 14, the base 500 includes active regions 510 and shallow trench isolation regions 520. The active regions 510 in the base 500 are arranged independent of each other, and the shallow trench isolation regions 520 isolates the active regions 510 from each other. The active region 510 may be a P-type active region or an N-type active region, and a material of the active region 510 includes a semiconductor material. In this embodiment, the material of the active region 510 includes a P-type doped semiconductor material. A material of the shallow trench isolation region 520 may include silicon oxide.

As shown in FIG. 12, a plurality of parallel word line channels 530 are formed in the base 500. The word line channel 530 penetrates a part of the active region 510 and a part of the shallow trench isolation region 520 that are exposed in the base 500. Both ends of each active region 510 intersect with one word line channel 530. The word line channel 530 includes a gate channel 531 penetrating the active region 510 and a conductive channel 532 penetrating the shallow trench isolation region 520.

Step S200: Form a gate conductive layer, where the gate conductive layer covers a part of the word line channel.

The method for forming the gate conductive layer 710 in step S200 in this embodiment is the same as the implementation manner of step S20 in the foregoing embodiment.

Figure 15:
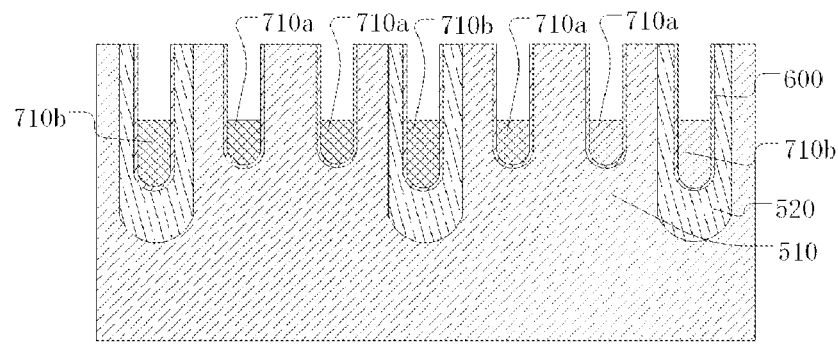
FIG. 15 is a schematic diagram of an A-A cross section of a gate conductive layer in a method of manufacturing a semiconductor structure according to an exemplary embodiment.
Figure 16:
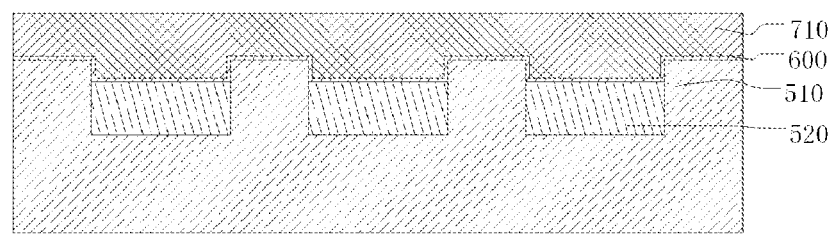
FIG. 16 is a schematic diagram of a B-B cross section of a gate conductive layer in a method of manufacturing a semiconductor structure according to an exemplary embodiment.

As shown in FIG. 15 and FIG. 16 with reference to FIG. 13 and FIG. 14, a gate conductive material is deposited through ALD or CVD. The gate conductive material fills a part of the word line channel 530 to form the gate conductive layer 710. The gate conductive layer 710 is located at the bottom of the word line channel 530. A material of the gate conductive layer 710 may include a metal nitride. For example, the material of the gate conductive layer 710 may include one or more of titanium nitride and indium nitride. In this embodiment, the material of the gate conductive layer 710 includes titanium nitride.

Step S300: Form a semiconductor doped layer, where the semiconductor doped layer fills the word line channel and covers the gate conductive layer, and a doping concentration of the semiconductor doped layer at a side close to a top surface of the gate conductive layer is different from a doping concentration of the semiconductor doped layer at a side away from the top surface of the gate conductive layer.

The method for forming the semiconductor doped layer 720 in step S300 in this embodiment is the same as the implementation manner of step S30 in the foregoing embodiment.

Figure 17:
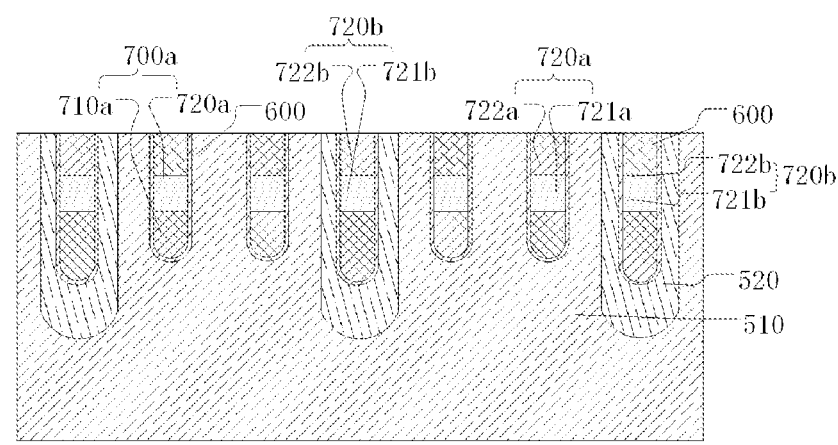
FIG. 17 is a schematic diagram of an A-A cross section of a semiconductor structure in a method of manufacturing a semiconductor structure according to an exemplary embodiment.
Figure 18:
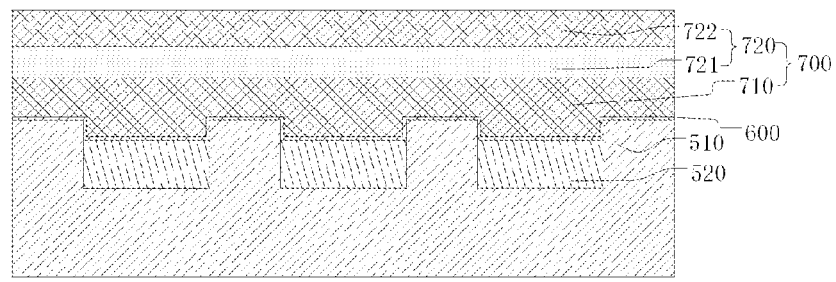
FIG. 18 is a schematic diagram of a B-B cross section of a semiconductor structure in a method of manufacturing a semiconductor structure according to an exemplary embodiment.

As shown in FIG. 17 and FIG. 18 with reference to FIG. 12, FIG. 15, and FIG. 16, a semiconductor doped layer 720 may be formed by depositing a doped semiconductor material, or a semiconductor material layer may be formed by depositing an undoped semiconductor material to fill the word line channel 530, and then doped impurities are implanted into the semiconductor material layer through a thermal diffusion process or an ion implantation process to form the semiconductor doped layer 720.

The semiconductor doped layer 720 formed in step S300 in this embodiment is the same as the structure of the semiconductor doped layer 320 formed in step S30 in the foregoing embodiment. As shown in FIG. 17 and FIG. 18, the semiconductor doped layer 720 may include a first semiconductor doped layer 721 and a second semiconductor doped layer 722. The first semiconductor doped layer 721 covers a top surface of the gate conductive layer 710, and a doping concentration of the second semiconductor doped layer 722 is greater than a doping concentration of the first semiconductor doped layer 721. A conductive type of the first semiconductor doped layer 721 is the same as that of the second semiconductor doped layer 722.

Figure 19:
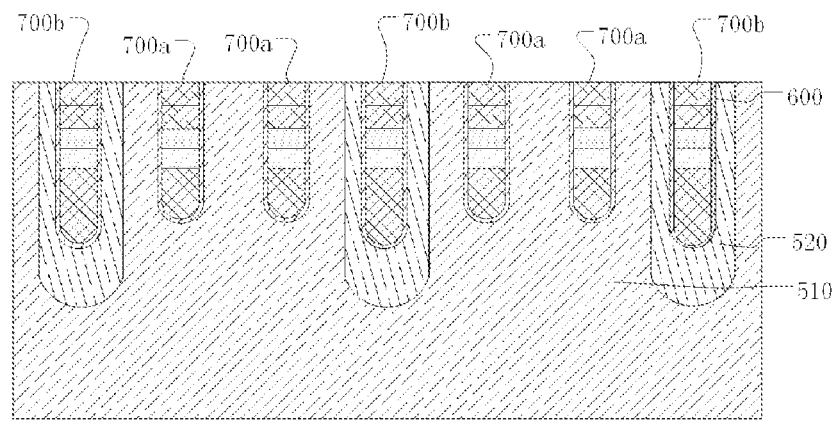
FIG. 19 is a schematic diagram of an A-A cross section of a semiconductor structure in a method of manufacturing a semiconductor structure according to an exemplary embodiment.
Figure 20:
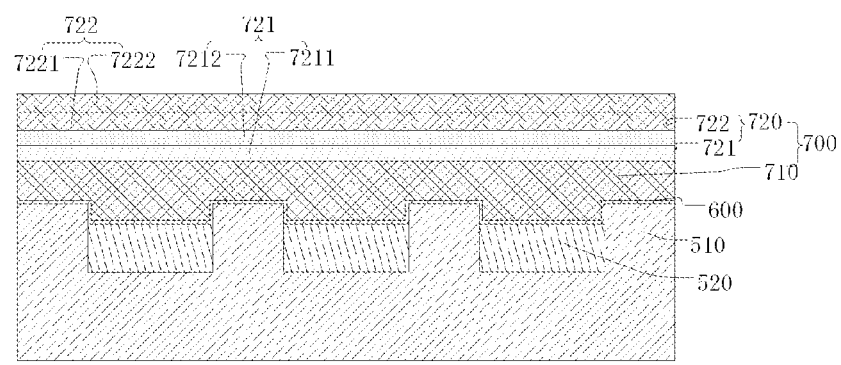
FIG. 20 is a schematic diagram of a B-B cross section of a semiconductor structure in a method of manufacturing a semiconductor structure according to an exemplary embodiment.

In some embodiments, as shown in FIG. 19 and FIG. 20, in a direction from the gate conductive layer 710 to the second semiconductor doped layer 722, the first semiconductor doped layer 721 includes a first doped region 7211 and a second doped region 7212 that are sequentially arranged, where a doping concentration of the first doped region 7211 is different from that of the second doped region 7212.

In some embodiments, as shown in FIG. 19 and FIG. 20, in a direction from the first semiconductor doped layer 721 to the top surface of the base 500, the second semiconductor doped layer 722 includes a third doped region 7221 and a fourth doped region 7222 that are sequentially arranged, where a doping concentration of the third doped region 7221 is different from that of the fourth doped region 7222.

In the semiconductor structure formed in this embodiment, as shown in FIG. 17, FIG. 18, and FIG. 19, the semiconductor doped layer 720 and the gate conductive layer 710 jointly form the word line structure 700. The word line structure 700 formed in this embodiment includes a first gate 700*a* penetrating the active region 510 and a second gate 700*b* penetrating the shallow trench isolation region 520. In an extension direction of the word line structure 700, the first gate 700*a* and the second gate 700*b* in the word line structure 700 are connected. As shown in FIG. 17 with reference to FIG. 13, the first gate 700*a* is disposed in the gate channel 531, and the second gate 700*b* is disposed in the conductive channel 532.

As shown in FIG. 13 and FIG. 17, from the bottom of the word line channel 530 to the top surface of the base 500, the first gate 700*a* includes a gate conductive layer 710*a* and a semiconductor doped layer 720*a* that are sequentially arranged. As shown in FIG. 15, FIG. 17 and FIG. 19, the second gate 700*b* includes a gate conductive layer 710*b* and a semiconductor doped layer 720*b* that are sequentially arranged.

As shown in FIG. 19, the first gate 700*a* may be used as a gate electrode (also known as a gate or a control gate) of a transistor, to control the on and off of the transistor. In this embodiment, the first gate 700*a* is used as a gate electrode of a recess channel transistor. The second gate 700*b* is disposed in the shallow trench isolation region 520 and adjacent to the active region 510, and is configured to communicate the first gates 700*a* in different active regions 510, to form an RCAT.

The semiconductor structure formed in this embodiment may form an RCAT; the first gate is used as the gate electrode of the transistor and includes a gate conductive layer and a semiconductor doped layer. Work functions of the metal nitride in the gate conductive layer and the gate channel have a large difference; work functions of the semiconductor material doped in the semiconductor doped layer and the gate channel have a small difference. The gate electrode of the transistor has a large threshold voltage near the bottom of the gate channel and has a small threshold voltage near the top surface of the base. The gate-drain overlapping interface of the transistor has a small voltage, to avoid gate-induce drain leakage at the gate-drain overlapping interface of the transistor.

Meanwhile, the conductive layer of the gate electrode of the transistor generates a high threshold voltage near the bottom of the gate channel, and the semiconductor doped layer generates a low threshold voltage above the gate electrode. A varying electric field from the bottom of the gate channel to the gate-drain interface of the transistor is generated. The transistor is refreshed and read multiple times, and the gate electrode of the transistor is constantly turned on and off, which may cause a capacitive coupling interference between adjacent transistors. In the semiconductor structure formed in this embodiment, by forming a varying electric field in the gate channel of the RCAT, the trajectory of electron motion can be changed, so that leakage electrons flow to the conductive layer of the first gate, thereby reducing the impact of row hammer effect and improving the reliability of the device.

According to an exemplary embodiment of the present disclosure, this embodiment is a further description of step S100 in the foregoing embodiment.

In this embodiment, referring to FIG. 13 and FIG. 14, the providing a base includes: providing a semiconductor substrate, where the semiconductor substrate is a P-type substrate, and a material of the semiconductor substrate includes a semiconductor material. For example, the material of the semiconductor substrate may include one or more of a group consisting of silicon, germanium, a silicon-germanium compound, and a silicon-carbon compound. A mask pattern is formed on a top surface of the semiconductor substrate, and a part of the semiconductor substrate is removed according to the mask pattern to form shallow trenches, where the shallow trenches divide the retained semiconductor substrate into active regions 510 independent of each other. A low-k dielectric material is filled in the shallow trench to form a shallow trench isolation region 520. In this embodiment, the low-k dielectric material is silicon oxide.

A hard mask is formed. The hard mask covers top surfaces of the active region 510 and the shallow trench isolation region 520. The hard mask is patterned through self-aligned double patterning (SADP) to form a word line pattern. A part of the active region 510 and a part of the shallow trench isolation region 520 are removed according to the word line pattern by using a dry etching process or a wet etching process, to form a word line trench.

Referring to FIG. 13 and FIG. 14, during removal of a part of the active region 510 and a part of the shallow trench isolation region 520, the etching selectivity of the active region 510 and the shallow trench isolation region 520 in the etching process is controlled, so that a removal speed of the shallow trench isolation region 520 is higher than a removal speed of the active region 510 in the etching process, and the formed word line trench has a greater depth in the shallow trench isolation region 520 than in the active region 510. In an extension direction of the word line trench, a cross section of the word line trench is in a corrugated shape.

A gate oxide layer is formed, where the gate oxide layer covers the word line trench.

Referring to FIG. 13 and FIG. 14, a gate oxide layer material is deposited through ALD or CVD to form a gate oxide layer 600, where the gate oxide layer 600 covers the word line trench to define a word line channel 530 in the word line trench. A material of the gate oxide layer 600 is silicon oxide. In this embodiment, the material of the gate oxide layer 600 is silicon dioxide.

A word line structure is formed in the word line channel of this embodiment, where a height of the second gate is greater than that of the first gate, and the second gate is arranged between two adjacent first gates to isolate the adjacent first gates from each other. The isolation height of the second gate is increased to improve an isolation effect of the second gate, so as to reduce interference between adjacent transistors and avoid current leakage from the transistor to the neighboring transistor, thereby further reducing the row hammer effect.

According to an exemplary embodiment of the present disclosure, this embodiment provides a semiconductor structure. As shown in FIG. 7 with reference to FIG. 4, the semiconductor structure includes: a base 100, a channel 131 provided in the base 100, a gate conductive layer 310, and a semiconductor doped layer 320. The gate conductive layer 310 is disposed in the channel 131 and covers a part of the channel 131. The semiconductor doped layer 320 covers a top surface of the gate conductive layer 310 and fills a part, which is not filled with the gate conductive layer 310, in the channel 131. A height of the gate conductive layer 310 is greater than ⅓ of a depth of the channel. The semiconductor structure further includes a gate oxide layer 200. The gate oxide layer 200 is disposed between the gate conductive layer 310 and the channel 131, and between the semiconductor doped layer 320 and the channel 131.

In this embodiment, a doping concentration of the semiconductor doped layer 320 at a side close to a top surface of the gate conductive layer 310 is different from a doping concentration of the semiconductor doped layer 320 at a side away from the top surface of the gate conductive layer 310.

In the semiconductor structure in this embodiment, the gate conductive layer 310 generates a high threshold voltage at the bottom of the channel 131; the semiconductor doped layer 320 generates a low threshold voltage in the channel 131 above the gate conductive layer 310. Partial channel 131 covered by the gate conductive layer 310 is used as a main channel, and a threshold voltage exists between the main channel and the top surface of the base 100. Therefore, a gate-drain overlapping interface of a transistor formed by the semiconductor structure of this embodiment has a small voltage, to avoid gate-induce drain leakage at the gate-drain overlapping interface of the transistor.

According to an exemplary embodiment, most content of the semiconductor structure in this embodiment is the same as the foregoing embodiment. This embodiment differs from the foregoing embodiment in that, in a direction perpendicular to the base 100, a first height exists from the bottom of the gate conductive layer 310 to the top of the semiconductor doped layer 320, the gate conductive layer 310 has a second height, and the second height is greater than or equal to ⅓ of the first height.

According to an exemplary embodiment, most content of the semiconductor structure in this embodiment is the same as the foregoing embodiment. This embodiment differs from the foregoing embodiment in that, as shown in FIG. 9, the semiconductor doped layer 320 includes: a first semiconductor doped layer 321 covering the top surface of the gate conductive layer 310, where a top surface of the first semiconductor doped layer 321 is lower than the top surface of the base 100. The semiconductor doped layer 320 further includes a second semiconductor doped layer 322 covering the top surface of the first semiconductor doped layer 321, where a doping concentration of the second semiconductor doped layer 322 is different from that of the first semiconductor doped layer 321.

In some embodiments, the doping concentration of the first semiconductor doped layer 321 is lower than that of the second semiconductor doped layer 322.

As shown in FIG. 9, in the direction perpendicular to the base 100, the first semiconductor doped layer 321 has a third height, and the third height is less than or equal to ⅓ of the first height; the second semiconductor doped layer 322 has a fourth height, and the fourth height is less than or equal to ⅓ of the first height.

In the semiconductor structure of this embodiment, as shown in FIG. 4 and FIG. 9, the gate conductive layer 310, the first semiconductor doped layer 321, and the second semiconductor doped layer 322 generate different threshold voltages in the channel. A varying electric field from the bottom of the channel 131 to the top surface of the base 100 is formed in the semiconductor structure. The varying electric field can change the trajectory of electron motion, so that leakage electrons flow to the gate conductive layer, thereby reducing the impact of row hammer effect and improving the reliability of the device.

According to an exemplary embodiment, most content of the semiconductor structure in this embodiment is the same as the foregoing embodiment. This embodiment differs from the foregoing embodiment in that, referring to FIG. 9, in the direction perpendicular to the base 100, a doping concentration of a first dopant in the first semiconductor doped layer 321 changes gradually.

In the direction perpendicular to the base 100, a doping concentration of a second dopant in the second semiconductor doped layer 322 changes gradually.

For example, the doping concentration of the first semiconductor doped layer 321 at a side close to the top surface of the gate conductive layer 310 is $10^{13}$ atoms/cm², and the doping concentration of the first semiconductor doped layer 321 at a side away from the top surface of the gate conductive layer 310 is $10^{14}$ atoms/cm².

In this embodiment, the doping concentration of the second semiconductor doped layer 322 at a side close to the top surface of the first semiconductor doped layer 321 is $10^{14}$ atoms/cm², and the doping concentration of the second semiconductor doped layer 322 at a side away from the top surface of the first semiconductor doped layer 321 is $10^{15}$ atoms/cm².

In the semiconductor structure of this embodiment, referring to FIG. 4 and FIG. 9, an electric field with a threshold voltage gradually decreasing from a bottom surface of the channel 131 to the top surface of the base 100 is formed in the channel 131. The semiconductor structure has a minimum threshold voltage at the top surface of the base 100. Therefore, a gate-drain overlapping interface of a transistor formed by the semiconductor structure of this embodiment has a minimum voltage, to avoid gate-induce drain leakage at the gate-drain overlapping interface of the transistor.

According to an exemplary embodiment, most content of the semiconductor structure in this embodiment is the same as the foregoing embodiment. This embodiment differs from the foregoing embodiment in that, referring to FIG. 11, in the direction perpendicular to the base 100, the first semiconductor doped layer 321 includes a first doped region 3211 and a second doped region 3212, and the second semiconductor doped layer 322 includes a third doped region 3221 and a fourth doped region 3222.

In this embodiment, a doping concentration of the first doped region 3211 is less than that of the second doped region 3212. For example, the doping concentration of the first doped region 3211 is $10^{13}$ atoms/cm², and the doping concentration of the second doped region 3212 is $10^{14}$ atoms/cm².

In this embodiment, the doping concentration of the second semiconductor doped layer 322 is $10^{15}$ atoms/cm².

In the semiconductor structure of this embodiment, referring to FIG. 4 and FIG. 11, a threshold voltage gradually decreasing from the bottom surface of the channel 131 to the top surface of the base 100 is formed in the channel 131, which reduces the electric field around the semiconductor structure, alleviating the gate-induce drain leakage of the gate-drain overlapping interface, and further reducing the interference between adjacent transistors.

According to an exemplary embodiment of the present disclosure, this embodiment provides a semiconductor structure. As shown in FIG. 17 and FIG. 18, or FIG. 19 and FIG. 20, with reference to FIG. 12, the semiconductor structure includes: a base 500, a word line channel 530 provided in the base 500, a gate oxide layer 600, a gate conductive layer 710, and a semiconductor doped layer 720. The gate oxide layer 600 covers the word line channel 530. The gate conductive layer 710 fills a part of the word line channel 530. The gate conductive layer 710 and the base 100 are isolated from each other by the gate oxide layer 600. The semiconductor doped layer 720 covers a top surface of the gate conductive layer 710 and fills a part, which is not filled by the gate conductive layer 710, in the word line channel 530. The semiconductor doped layer 730 and the base 100 are isolated from each other by the gate oxide layer 600. The gate conductive layer 710 and the semiconductor doped layer 720 jointly form the word line structure 700. A doping concentration of the semiconductor doped layer 720 at a side close to the top surface of the gate conductive layer 710 is different from a doping concentration of the semiconductor doped layer 720 at a side away from the top surface of the gate conductive layer 710.

Referring to FIG. 13 and FIG. 14, the base 500 includes active regions 510 and shallow trench isolation regions 520. The word line channel 530 penetrates a part of the active region 510 and a part of the shallow trench isolation region 520 that are exposed in the base 100. Both ends of each active region 510 intersect with one word line channel 530.

The word line channel 530 includes a gate channel 531 penetrating the active region 510 and a conductive channel 532 penetrating the shallow trench isolation region 520.

As shown in FIG. 13, FIG. 17 and FIG. 18, or as shown in FIG. 19 and FIG. 20, the word line structure 700 includes a first gate 700a penetrating the active region 510 and a second gate 700b penetrating the shallow trench isolation region 520. In an extension direction of the word line structure 700, the first gates 700a and the second gates 700b are arranged alternately in the word line structure 700. From the bottom of the word line channel 530 to the top surface of the base 100, the first gate 700a includes a first gate conductive layer 710a and a first gate semiconductor doped layer 720a that are sequentially arranged; the second gate 700b includes a gate conductive layer 710b and a second gate semiconductor doped layer 720b that are sequentially arranged.

According to an exemplary embodiment, most content of the semiconductor structure in this embodiment is the same as the foregoing embodiment. This embodiment differs from the foregoing embodiment in that, referring to FIG. 13 and FIG. 14, a depth of the conductive channel 532 is greater than a depth of the gate channel 531, and in an extension direction of the word line channel 530, a cross section of the word line channel 530 is in a corrugated shape.

As shown in FIG. 17 and FIG. 18, or FIG. 19 and FIG. 20, a bottom surface of the second gate 700b of the word line structure 700 is lower than a bottom surface of the first gate 700a, and the second gate 700b achieves a better isolation effect between two adjacent first gates 700a, thereby better reducing the interference between two adjacent first gates 700a and further reducing the row hammer effect.

The method of manufacturing a semiconductor structure and the semiconductor structure provided by the present disclosure reduces the voltage of the semiconductor structure at the gate-drain overlapping interface by using such a changeable work function of the semiconductor material, thus reducing the gate-induce drain leakage of the semiconductor structure at the gate-drain overlapping interface.

The embodiments or implementations of this specification are described in a progressive manner, and each embodiment focuses on differences from other embodiments. The same or similar parts between the embodiments may refer to each other.

In the description of the specification, the description with reference to terms such as "an embodiment", "an exemplary embodiment", "some implementations", "a schematic implementation", and "an example" means that the specific feature, structure, material, or characteristic described in combination with the implementation(s) or example(s) is included in at least one implementation or example of the present disclosure.

In this specification, the schematic expression of the above terms does not necessarily refer to the same embodiment or example. Moreover, the described specific feature, structure, material or characteristic may be combined in an appropriate manner in any one or more implementations or examples.

It should be noted that in the description of the present disclosure, the terms such as "center", "top", "bottom", "left", "right", "vertical", "horizontal", "inner" and "outer" indicate the orientation or position relationships based on the drawings. These terms are merely intended to facilitate description of the present disclosure and simplify the description, rather than to indicate or imply that the mentioned apparatus or element must have a specific orientation and must be constructed and operated in a specific orientation. Therefore, these terms should not be construed as a limitation to the present disclosure.

It can be understood that the terms such as "first" and "second" used in the present disclosure can be used to describe various structures, but these structures are not limited by these terms. Instead, these terms are merely intended to distinguish one element from another.

The same elements in one or more drawings are denoted by similar reference numerals. For the sake of clarity, various parts in the drawings are not drawn to scale. In addition, some well-known parts may not be shown. For the sake of brevity, the structure obtained by implementing multiple steps may be shown in one figure. In order to make the understanding of the present disclosure more clearly, many specific details of the present disclosure, such as the structure, material, size, processing process, and technology of the device, are described below. However, as those skilled in the art can understand, the present disclosure may not be implemented according to these specific details.

Finally, it should be noted that the above embodiments are merely intended to explain the technical solutions of the present disclosure, rather than to limit the present disclosure. Although the present disclosure is described in detail with reference to the above embodiments, those skilled in the art should understand that they may still modify the technical solutions described in the above embodiments, or make equivalent substitutions of some or all of the technical features recorded therein, without deviating the essence of the corresponding technical solutions from the scope of the technical solutions of the embodiments of the present disclosure.

The invention claimed is:

1. A method of manufacturing a semiconductor structure, comprising:
   providing a base, wherein a channel is formed in the base;
   forming a gate conductive layer, wherein the gate conductive layer covers a part of the channel; and
   forming a semiconductor doped layer, wherein the semiconductor doped layer fills the channel and covers the gate conductive layer, and a doping concentration of the semiconductor doped layer at a side close to a top surface of the gate conductive layer is different from a doping concentration of the semiconductor doped layer at a side away from the top surface of the gate conductive layer.

2. The method of manufacturing a semiconductor structure according to claim 1, wherein forming the semiconductor doped layer comprises:
   forming a first semiconductor doped layer, wherein the first semiconductor doped layer covers the top surface of the gate conductive layer, and a top surface of the first semiconductor doped layer is lower than a top surface of the base; and
   forming a second semiconductor doped layer, wherein the second semiconductor doped layer covers the top surface of the first semiconductor doped layer,
   wherein a doping concentration of the second semiconductor doped layer is different from a doping concentration of the first semiconductor doped layer.

3. The method of manufacturing a semiconductor structure according to claim 2, wherein the second semiconductor doped layer and the first semiconductor doped layer are of a same conductive type.

4. The method of manufacturing a semiconductor structure according to claim 3, wherein the forming a first semiconductor doped layer comprises:

depositing a first semiconductor material, and performing first doping on the first semiconductor material to form a first doped region, wherein the first doped region covers the top surface of the gate conductive layer; and performing second doping on the first semiconductor material to form a second doped region, wherein the second doped region covers a top surface of the first doped region, wherein a doping concentration of the second doped region is different from a doping concentration of the first doped region.

5. The method of manufacturing a semiconductor structure according to claim 2, wherein the forming a second semiconductor doped layer comprises:

depositing a second semiconductor material, and performing first doping on the second semiconductor material to form a third doped region, wherein the third doped region covers the top surface of the first semiconductor doped layer; and performing second doping on the second semiconductor material to form a fourth doped region, wherein the fourth doped region covers a top surface of the third doped region, wherein a doping concentration of the fourth doped region is different from a doping concentration of the third doped region.

6. The method of manufacturing a semiconductor structure according to claim 2, wherein the doping concentration of the second semiconductor doped layer is greater than the doping concentration of the first semiconductor doped layer.

7. The method of manufacturing a semiconductor structure according to claim 1, wherein the forming a gate conductive layer comprises:

filling the channel with an initial gate conductive layer; and etching back the initial gate conductive layer, and retaining a part of the initial gate conductive layer having a height greater than or equal to ⅓ of a depth of the channel to form the gate conductive layer.

8. A semiconductor structure, comprising:

a base, wherein the base comprises a channel;

a gate conductive layer, wherein the gate conductive layer covers a part of the channel; and a semiconductor doped layer, wherein the semiconductor doped layer fills the channel and covers the gate conductive layer, and a doping concentration of the semiconductor doped layer at a side close to a top surface of the gate conductive layer is different from a doping concentration of the semiconductor doped layer at a side away from the top surface of the gate conductive layer.

9. The semiconductor structure according to claim 8, wherein in a direction perpendicular to the base, a first height exists from a bottom of the gate conductive layer to a top of the semiconductor doped layer, the gate conductive layer has a second height, and the second height is greater than or equal to ⅓ of the first height.

10. The semiconductor structure according to claim 9, wherein the semiconductor doped layer comprises:

a first semiconductor doped layer, wherein the first semiconductor doped layer covers a top surface of the gate conductive layer, and a top surface of the first semiconductor doped layer is lower than a top surface of the base; and a second semiconductor doped layer, wherein the second semiconductor doped layer covers the top surface of the first semiconductor doped layer, wherein a doping concentration of the second semiconductor doped layer is different from a doping concentration of the first semiconductor doped layer.

11. The semiconductor structure according to claim 10, wherein the first semiconductor doped layer comprises a first dopant, the second semiconductor doped layer comprises a second dopant, and the first dopant and the second dopant are of a same conductive type.

12. The semiconductor structure according to claim 11, wherein in the direction perpendicular to the base, a doping concentration of the first dopant in the first semiconductor doped layer changes gradually.

13. The semiconductor structure according to claim 11, wherein in the direction perpendicular to the base, a doping concentration of the second dopant in the second semiconductor doped layer changes gradually.

14. The semiconductor structure according to claim 11, wherein in the direction perpendicular to the base, the first semiconductor doped layer has a third height, the third height is less than or equal to ⅓ of the first height, the second semiconductor doped layer has a fourth height, and the fourth height is less than or equal to ⅓ of the first height.

15. The semiconductor structure according to claim 10, wherein the doping concentration of the first semiconductor doped layer is less than the doping concentration of the second semiconductor doped layer.

* * * * *